US008775902B2

(12) United States Patent
Ootsuka

(10) Patent No.: US 8,775,902 B2
(45) Date of Patent: Jul. 8, 2014

(54) MEMORY CONTROLLER AND STORAGE DEVICE

(71) Applicant: Panasonic Corporation, Osaka (JP)

(72) Inventor: Takeshi Ootsuka, Hyogo (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 13/644,183

(22) Filed: Oct. 3, 2012

(65) Prior Publication Data

US 2013/0091404 A1 Apr. 11, 2013

(30) Foreign Application Priority Data

Oct. 7, 2011 (JP) ................................ 2011-222482

(51) Int. Cl.

*G11C 29/00* (2006.01)
*G06F 11/10* (2006.01)
*H03M 13/03* (2006.01)
*H03M 13/29* (2006.01)
*H04L 1/00* (2006.01)

(52) U.S. Cl.

CPC ....... *G06F 11/1068* (2013.01); *H03M 13/2975* (2013.01); *H04L 1/0051* (2013.01); *H03M 13/2957* (2013.01); *H03M 13/03* (2013.01)
USPC 714/763; 714/758; 714/E11.03; 714/E11.032

(58) Field of Classification Search

CPC ............. G06F 11/1044; G06F 11/108; G06F 11/1068; H30M 13/03
USPC .................... 714/758, 763, E11.03, E11.032
See application file for complete search history.

(56) References Cited

U.S. PATENT DOCUMENTS 7,571,356 B2 * 8/2009 Inoue et al. .................... 714/42
2007/0028140 A1 * 2/2007 Takeda ............................ 714/6
2010/0257436 A1 * 10/2010 Asauchi ....................... 714/805
2011/0167319 A1 * 7/2011 Jeddeloh ...................... 714/763
2011/0231732 A1 * 9/2011 Chu ............................ 714/763
2012/0284587 A1 * 11/2012 Yu et al. ...................... 714/773

FOREIGN PATENT DOCUMENTS

JP 2006-18373 1/2006

* cited by examiner

*Primary Examiner* — Guy Lamarre
(74) *Attorney, Agent, or Firm* — Wenderoth, Lind & Ponack, LLP.

(57) ABSTRACT

According to one embodiment, a memory controller that writes write data provided from a host device into a memory, reads read data from the memory, and transmits the read data to the host device. The memory controller includes an external interface, a first ECC generating unit, an access unit, a first ECC correcting unit, and a control unit.

10 Claims, 9 Drawing Sheets

MEMORY CONTROLLER AND STORAGE DEVICE

BACKGROUND

1. Technical Field

The present disclosure relates to a memory controller and a storage device and the like that control to suppress degradation due to variation in a data holding characteristic and the number of times of rewriting of a nonvolatile memory.

2. Related Art

Conventionally, a semiconductor storage device such as an SD (Secure Digital) card as a card-type recording medium which incorporates therein a flash memory is extremely compact and extremely thin. Because of its easiness of handling, the semiconductor storage device is widely used to record data such as images in digital cameras and portable devices.

The flash memory incorporated in the semiconductor storage device is configured by many physical blocks of a fixed size, and can erase data in a unit of a physical block. To respond to recent demands for a larger capacity, multiple-value flash memories (MLC: Multi-Level Cell) that can accumulate data of two or more bits in one cell are commercialized as flash memories.

FIG. 1 shows an example of a relationship between a threshold voltage (Vth) and the number of electrons that are accumulated in a floating gate of a multiple-value flash memory. As shown in FIG. 1, in a four-value flash memory, an accumulation state of electrons in the floating gate is managed in four states in accordance with the threshold voltages (Vth). An erase state has a lowest potential, and this state is expressed as (1, 1). Along with accumulation of electrons, threshold voltages discretely increase, and these states are expressed as (1, 0), (0, 0), and (0, 1). Because threshold potentials increase in proportion to the number of accumulated electrons in this way, two-bit data can be recorded in one memory cell by controlling the threshold value to be settled at a predetermined potential.

However, in the multiple-value flash memory, because the four states are discriminated by a charge quantity of electrons, a difference of threshold voltages between the states is smaller than that of a two-value memory (SLC: Single Level Cell).

Further, when data rewriting is repeated each time the number of times of rewriting increases, a slight damage occurs in a gate oxide film by injection and extraction of electrons. When these damages are accumulated, many electron traps are formed. Therefore, the number of electrons accumulated in the actual floating gate decreases. Because the number of electrons accumulated in the floating gate becomes small in proportion to a finely divided semiconductor process, an influence of the electron traps becomes large.

In this way, in accordance with the multiple-value recording that supports a larger capacity of the flash memory and miniaturization of a semiconductor process, a problem of degradation in the data holding characteristic of the flash memory has become noticeable.

A first method for solving the above problem is to reinforce error correction. For example, error correction of a flash memory of 20n generation is based on 40-bit correction, and error correction of a flash memory of 10n generation is based on 60-bit correction.

A second method for solving the above problem is a method called leveling that equalizes the number of times of rewriting blocks of the flash memory. Leveling is a method of managing an address of the flash memory to convert a logical address as an interface with an outside into a physical address that is internally managed, and write data written in the same logical address into an actually different physical address. However, variation in the data holding characteristic of a cell of the flash memory cannot be shielded by the leveling.

In Japanese Unexamined Patent Publication No. 2006-18373, the following is proposed. In a flash memory configured by a plurality of chips, blocks in mutually different chips of the flash memory are associated, and the associated plurality of blocks are handled as a common group. Then, by allocating one block in a group to a block for parity of user data written in other block in the corresponding group, an error correction capacity is reinforced, thereby suppressing degradation in the data holding characteristic of the flash memory.

As described above, the required number of error corrections following the miniaturization of a semiconductor process tends to increase. Therefore, there are commercialized flash memories such as an error-free NAND that incorporates an error correction function in the flash memory itself and a Management-NAND that accesses by a logical address, not only by the error correcting access, and internally averages the numbers of times of rewriting.

Although error correction policies of the error-free NAND and the Management-NAND are not fixed, in performing error correction of a maximum number of bits, there is a very small possibility that throughput of a maximum interface speed of the flash memory is satisfied. This is because an error correction algorithm employed by error correction of a BCH code and the like becomes the following (P1), (P2).

(P1) Possibility of error correction and decision of the number of correction bits (P2) Detection and correction of error correction position To achieve the (P2), a method of repeatedly performing error correction of few bits by considering an installation area and power consumption is often employed.

In the Management-NAND, because management of a flash memory is internally performed, data reading is performed by issuing a read command using a read-prefix logical address and the number of sectors to be read as arguments. When a reading error occurs, this is notified by an interruption signal or the like. Therefore, success of read operation can be known only in a read command unit.

A problem when the Management-NAND is used instead of a flash memory in the configuration of Japanese Unexamined Patent Publication No. 2006-18373, for example, is described below.

By using five Management-NANDs, user data is written into four Management-NANDs, and parity data of the user data is written into one Management-NAND. The parity data is generated by calculating EXOR of 4-byte user data extracted from each Management-NAND.

FIG. 2 is a view showing assignment of logical sectors and Management-NANDs. In FIG. 2, M0, M1, M2, M3, M4 respectively denote Management-NANDs having a capacity of 2 MB. Into a Management-NAND (M0), sector0, sector4, . . . , sector4092 are written. Into a Management-NAND (M1), sector1, sector5, . . . , sector4093 are written. Into a Management-NAND (M2), sector2, sector6, . . . , sector4094 are written. Into a Management-NAND (M3), sector3, sector7, . . . sector4095 are written. Into a Management-NAND (M4), Parity sector0, Parity sector1, Parity . . . , sector1023 are written. In this case, Parity sector0 denotes 512-byte parity data generated by calculating EXOR of user data of sector0, sector1, sector2, sector3. Similarly, Parity sector1 denotes 512-byte parity data generated by calculating EXOR of user data of sector4, sector5, sector6, sector7. Parity sector1023 denotes 512-byte parity data generated by calculating EXOR of user data of sector4092, sector4093, sector4094, sector4095.

In the case of reading data from a memory card in which the data is written in this way, there is a following problem. Data is read from the Management-NAND by issuing a read command using a read-prefix logical address and the number of sectors to be read as arguments. When a reading error occurs, the reading error is notified by an interruption signal or the like. Therefore, success of read operation can be known only in a read command unit.

According to the above method, in a read command of 4 Kbytes, for example, when an error occurs after reading first 2 Kbytes and an interruption occurs, a read command for reading only the latter 2 Kbytes needs to be issued to obtain data of the latter 2 Kbyte data. Further, when a reading error occurs in the first 512 bytes of the latter 2 Kbytes, a read command of an address of next 512 bytes needs to be issued. Therefore, a processing time at the time of occurrence of an error becomes large. As a result, at a position where a reading error occurs in video data reproduction, a transfer rate drops extremely, and omission of a video frame and the like occurs.

When a read command is issued in each Management-NAND in a sector unit to avoid the above operation, a process becomes simple, but a command overhead becomes large. Therefore, a transfer rate when an error does not occur drops.

SUMMARY

According to an embodiment, a memory controller that writes write data provided from a host device into a memory, reads read data from the memory, and transmits the read data to the host device. The memory controller includes an external interface configured to transmit and receive the write data/the read data to and from the host device, a first ECC generating unit configured to generate parity data and a first ECC code for the write data, an access unit configured to control writing and reading of the write data/the read data or parity data to and from the memory, a first ECC correcting unit configured to correct an error of read data, by using data and parity data read from the memory via the access unit, and a control unit configured to control the external interface, the first ECC generating unit, the access unit, and the first ECC correcting unit, wherein the control unit reads data in a first read unit upon reading data from the memory, and when an error occurs in the data read in the first read unit, reads the data in a second read unit having a reading size smaller than that of the first read unit by switching the first read unit to the second read unit, and controls the first ECC correcting unit to correct an error of the data that is read in the second read unit, by using the first ECC code.

Further, according to an embodiment, a storage device includes a memory configured to store data transmitted to a host device; and a controller configured to control the memory, the storage device writing write data provided from the host device into the memory, reading read data from the memory, and transmitting the read data to the host device. The memory controller includes an external interface configured to transmit and receive the write data/the read data to and from the host device, a first ECC generating unit configured to generate parity data and a first ECC code to the write data, an access unit configured to control writing and reading of the write data/the read data or parity data to and from the memory, a first ECC correcting unit configured to correct an error of the read data, by using the data and the parity data read from the memory via the access unit, and a control unit configured to control the external interface, the first ECC generating unit, the access unit, and the first ECC correcting unit. The control unit reads data in a first read unit upon reading data from the memory, and when an error occurs in the data read in the first read unit, reads the data in a second read having a reading size smaller than that of the first read unit by switching the first read unit to the second read unit, and controls to correct an error of the data that is read in the second read unit, by the first ECC correcting unit by using the first ECC code.

Based on the above configuration, when the first read unit corresponds to two pages of a memory, for example, the number of read commands can be substantially decreased, when addresses of a read command equal to or larger than a predetermined size or a series of read commands are continuous. As a result, reading performance can be achieved at a high speed.

When the second read unit is 512 bytes (=1 sector), for example, a reading error from each memory is detected in a one-sector unit. The first ECC correcting unit corrects data of an error-detected sector, by using data of a sector in which a reading error is not detected. Because an error can be corrected in a one-sector unit, an effect of error correction can be fully exerted.

That is, both high-speed reading and securing of reliability can be achieved, by using both a first read process of reading in a relatively large block, and a second read process of reading in a small block by attaching weight to precision of error correction.

Therefore, in the following embodiments, to solve the above problems, there are proposed a controller and the like that can achieve a stable high-speed read transfer while improving an error resistance by an iterated code configuration.

DETAILED DESCRIPTION OF PREFERRED EMBODIMENTS

First Embodiment

0. Configuration Example

Figure 3:
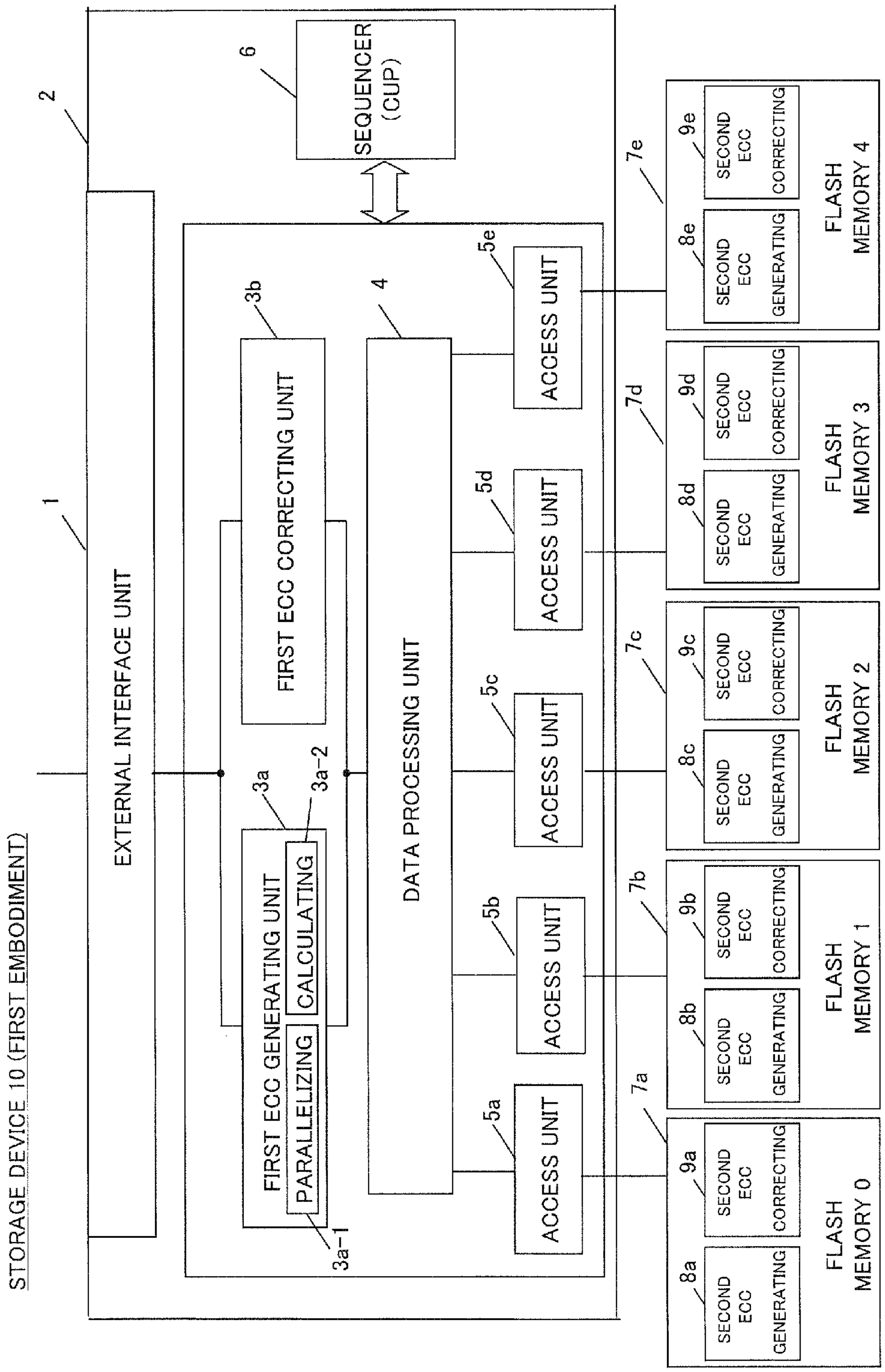
FIG. 3 is a configuration diagram of a storage device according to a first embodiment.

FIG. 3 is an overall configuration diagram of a storage device 10 according to a first embodiment. The storage device 10 according to the first embodiment includes a plurality of flash memories 7_a_ to 7_e_, each incorporating therein an error correction processing unit, and a memory controller 2 that writes and reads data to and from the flash memories 7_a_ to 7_e_.

Figure 4:
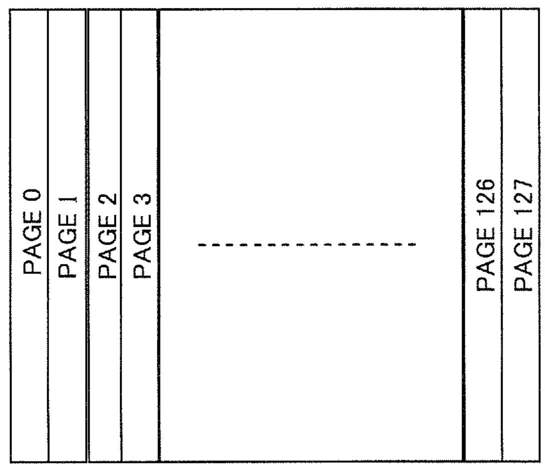
FIG. 4 is a configuration diagram of an erase block of a flash memory.

FIG. 4 is a configuration diagram of an erase block of the flash memories 7*a* to 7*e* used in the first embodiment.

The flash memories 7*a* to 7*e* are configured by a plurality of erase blocks, and each erase block is configured by a plurality of pages. The erase block shown in FIG. 4 is configured by 128 pages including page 0 to page 127, and data writing and reading are performed in a page unit. For example, when a data capacity per one page is 8 KB, an erase block size becomes 1 MB. When the number of erase blocks is 1 K, a capacity of the flash memory becomes 1 GB.

The flash memories 7*a* to 7*e* according to the first embodiment are installed with second ECC generating units 8*a* to 8*e* and second ECC correcting units 9*a* to 9*e*, respectively.

The memory controller 2 includes an external interface unit 1, a first ECC generating unit 3*a* that generates a first ECC code from user data transferred via the external interface unit 1, and a first ECC correcting unit 3*b* that performs error correction of data by using the first ECC code. The external interface unit 1 is an interface that performs transmission and reception of a command and user data from a host device (not shown). The memory controller 2 also includes a data processing unit 4 that distributes symbols generated by the first ECC generating unit 3*a* to five flash memories 7*a* to 7*e*. The data processing unit 4 rearranges error information indicating error correction impossibility output from the second ECC correcting units 9*a* to 9*e* and data from the flash memories 7*a* to 7*e*, in a code order of the first ECC code, and transfers the rearranged error information and data to the first ECC correcting unit 3*b*. The memory controller 2 includes the data processing unit 4, access units 5*a* to 5*e* that write data distributed to five systems by the data processing unit 4 into the flash memories 7*a* to 7*e* and also transfer the data from the flash memories 7*a* to 7*e* to the data processing unit 4, and a sequencer (CPU) 6. Details thereof will be described later.

The external interface unit 1 can be arranged at an outside of the memory controller 2.

1. Operation at Data Writing

Operation at the data writing of the storage device 10 according to the present embodiment is described below.

The first ECC generating unit 3*a* has a parallelizing unit 3*a*-1 that parallelizes user data transferred via the external interface unit 1, in a predetermined size unit, and an ECC calculating unit 3*a*-2 that generates an ECC code by adding parity data in a parallelized data unit. The ECC calculating unit generates a (5, 4) first ECC code. More specifically, the ECC calculating unit generates parity data by performing EXOR to parallelized 4-byte data. Considering an error resistance of a semiconductor defect or the like, it is desirable that the 4-byte data for generating the first ECC code is written into flash memories of separate chips. Therefore, input user data is allocated to each of four flash memories (7*a* to 7*d*), in each page (=for each 8 Kbytes). The parallelizing unit of the first ECC generating unit 3*a* parallelizes data of 8 Kbytes allocated to each flash memory into four parallel columns, inputs 4-byte data obtained by extracting each one byte from each column to the ECC calculating unit 3*a*-2, and generates parity data of the first ECC code.

Figure 5:
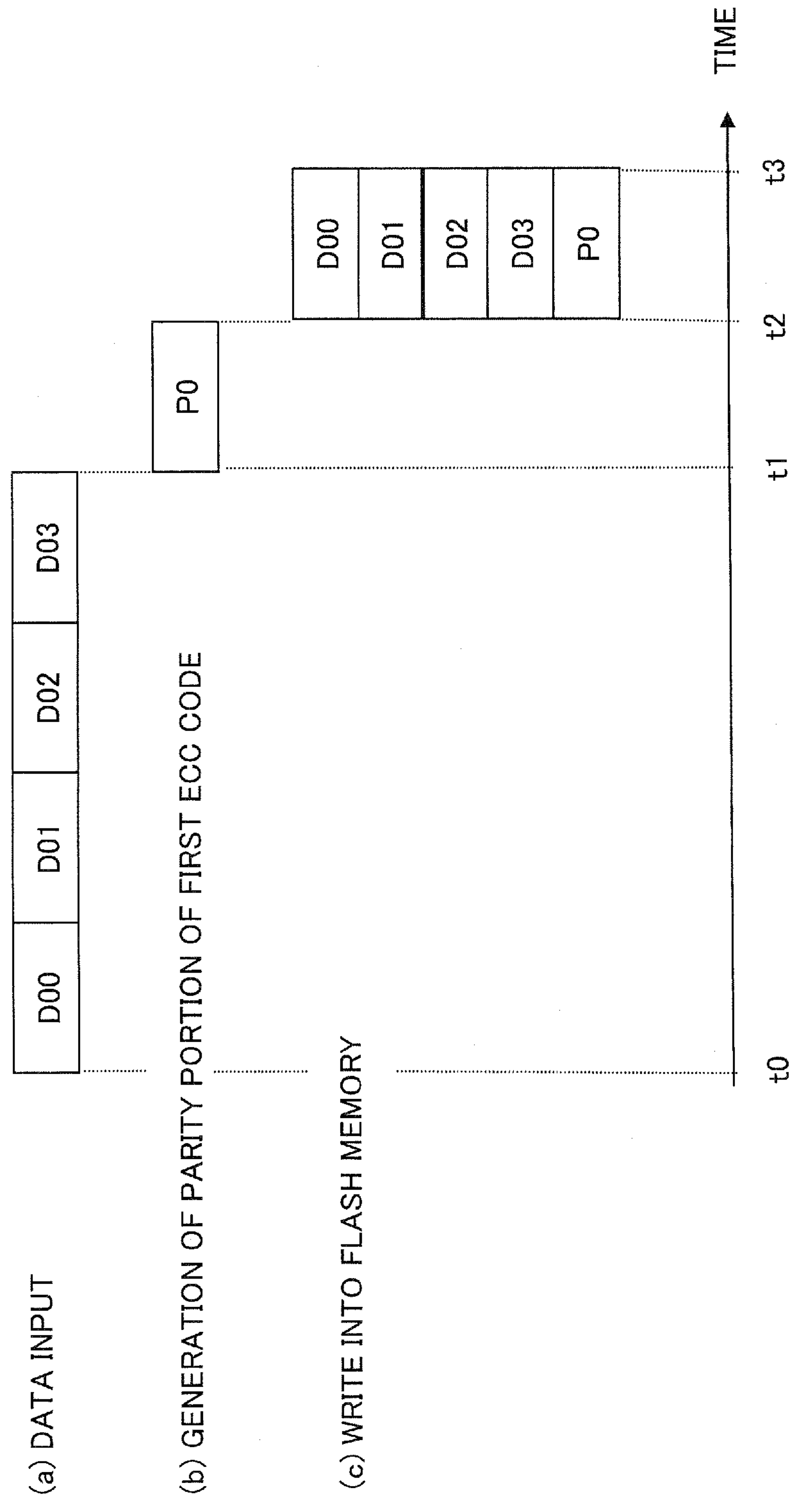
FIG. 5 is an operation explanatory diagram of a first ECC generating unit according to the first embodiment.

FIG. 5 is a diagram showing a timing chart of main portions in the write operation. In FIG. 5, portion (a) shows a data input timing of the external interface unit 1, portion (b) shows a processing timing of the first ECC generating unit 3*a*, and portion (c) shows a timing of data writing into the flash memories 7*a* to 7*e*.

At time t0, when write data D00, D01, D02, D03 of 8 Kbytes, respectively, are sequentially input from the external interface unit 1, a parallelizing unit 3*a*-1 of the first ECC generating unit 3*a* performs a parallelization process in a 16 sector (=8 Kbytes) unit.

Subsequently, at time t1, the ECC calculating unit 3*a*-2 of the first ECC generating unit 3*a* generates parity data P0 of 8 Kbytes from the input write data D00, D01, D02, D03 of total 32 Kbytes.

As described above, when write data of 64 sectors (=32 Kbytes) is input, the parallelizing unit 3*a*-1 of the first ECC generating unit 3*a* parallelizes the write data in four columns in a 16 sector (=8 Kbytes) unit. Subsequently, the ECC calculating unit 3*a*-2 of the first ECC generating unit 3*a* generates parity data of one byte in the parallelized 4-byte unit (see portions (a), (b) in FIG. 5). Because the parity data is generated by repeating for 8 K times, parity data of 8 Kbytes per user data of 32 Kbytes is generated in the present example.

Subsequently, at time t2, the data processing unit 4 allocates the parity data P0 of the parallelized write data D00, D01, D02, D03 to the flash memories 7*a* to 7*e* in an 8-Kbyte unit, respectively, as shown in portion (c) in FIG. 5.

Five series of data including the parity data distributed by the data processing unit 4 (the write data D00, D01, D02, D03 and the parity data P0) are written into the flash memories 7*a* to 7*e* via the access units 5*a* to 5*e*. In the present embodiment, the write data D00, D01, D02, D03 are written into the flash memories 7*a* to 7*d*, respectively, and the parity data P0 generated by the first ECC generating unit 3*a* is written into the flash memory 7*e*.

The sequencer 6 is configured by a CPU, for example, and controls the above processing timings of the first ECC generating unit 3*a*, the data processing unit 4, and the access units 5*a* to 5*e*.

Subsequently, in the flash memories 7*a* to 7*e*, second ECC codes obtained by adding parity data by the respective second ECC generating units 8*a* to 8*e* are generated to the input write data D00, D01, D02, D03 and parity data P0. Then, in the flash memories 7*a* to 7*e*, the generated second ECC codes are added to the input data D00, D01, D02, D03, P0, and the respective second ECC parities are written into memory cells corresponding to addresses.

Next, operation of the second ECC generating units 8*a* to 8*e* will be described. The second ECC generating units 8*a* to 8*e* extract each one byte from the first ECC code configured by five bytes, and generate and add second parity data to write data of collected 512 bytes and the parity data. In this case, although a BCH code and a Reed-Solomon code are used for an error correction code, a detailed description thereof is omitted because these codes are not the essence of the present example. For example, the Reed-Solomon code is used in the present embodiment. Next, (544, 512) ECC codes obtained by adding second parity data of 32 bytes are generated in a 512-byte unit. The second ECC codes have both functions of correcting an error of target 512-byte data, and detecting an error when error correction is impossible and providing error position information of the first ECC code.

The generated second ECC codes are stored in the same page of the erase block shown in FIG. 4.

2. Operation at Data Reading 2-1. Data Transfer Operation from Flash Memory at Data Reading First, transfer operation of read data from the flash memories 7*a* to 7*e* to the memory controller 2 at data reading will be described.

As described above, the flash memories 7*a* to 7*e* in FIG. 3 hold data and parity data written by control of the memory controller 2. In this case, as described above, the written data (D00, D01, D02, D03) are recorded in the flash memories 7*a* to 7*d*, respectively, and the parity data (P0) is recorded in the flash memory 7*e*.

The second ECC correcting units 9*a* to 9*e* installed in the respective flash memories perform error correction in a 512-byte unit to read data that are read in a page unit from memory cells.

The second FCC correcting units 9*a* to 9*e* can perform error correction of maximum 16 bytes in the Reed-Solomon code, because second parity data of 32 bytes is added to 512 bytes.

The access units 5*a* to 5*e* read data that are recorded in the flash memories 7*a* to 7*e* which are connected corresponding to the access units. The flash memories 7*a* to 7*e* that are used in the present embodiment incorporate the second ECC correcting units 9*a* to 9*e*. Therefore, the access units 5*a* to 5*e* output the error-corrected 512-byte data to the data processing unit 4, when the second ECC correcting units 9*a* to 9*e* of the respective flash memories 7*a* to 7*e* can perform error correction. On the other hand, when an error that exceeds 16 bytes occurs, the access units 5*a* to 5*e* output error information indicating correction impossibility to the data processing unit 4, because the second ECC correcting units 9*a* to 9*e* cannot correct the error.

The data processing unit 4 rearranges read data and error information that are transferred via the access units 5*a* to 5*e*, respectively, in a code order of the first ECC code, and transfers the rearranged result to the first ECC correcting unit 3*b*.

By using the first ECC code, the first ECC correcting unit 3*b* corrects the data in which the error information indicates that an error is impossible to be corrected. Specifically, because the first ECC code in the present example is a (5, 4) ECC code, EXOR of four bytes excluding error data is calculated in five bytes that generate the ECC code. With this arrangement, the data detected as an error can be corrected. Because a unit of detection of error information is 512 bytes, a position that becomes error data can be restored by performing the EXOR process for 512 times.

2-2. ECC Operation of Memory Controller at Data Reading

Next, ECC operation of the memory controller 2 that is performed to the read data transferred from the flash memories 7*a* to 7*e* at the read time will be described.

In the operation according to the present example, the sequencer 6 performs overall control of the memory controller 2. As described below, in a read sequence of the present example, two processes are performed, including a first read process in a first read unit, and a second read process in a second read unit that has a smaller read size than that of the first read unit. The second read process is performed only when error correction cannot be performed by the first read process.

As described above, units of reading data from respective flash memories are different between the first read process and the second read process.

More specifically, in the first read process, pieces of written data are read from a memory cell array, in a page unit of a flash memory or in a unit of integer times of a page, from the respective flash memories 7*a* to 7*e*. Accordingly, a reading speed of reading from the flash memories 7*a* to 7*e* can be optimized. For example, in the case of the flash memories 7*a* to 7*e* having a page size of 8 Kbytes, and when two pages can be simultaneously read, it is desirable that a read unit of reading from the flash memories in the first process is an integer times of 16 Kbytes. A reason for the integer times herein is that when data is accessed in a 32-Kbyte unit, the number of times of issuing a command in flash memory control becomes a half of that of access in a 16-Kbyte unit. However, when a read unit is too large, performance of random reading of a small block is degraded. Therefore, a read unit of reading from the flash memories needs to be determined by considering random read performance of a small block.

On the other hand, a read unit of reading from respective flash memories in the second read process is set as a minimum unit in the secondary ECC codes.

For example, considering a case where a block read from the flash memories 7*a* to 7*e* includes two second ECC codes (an ECC code in the first half+an ECC code in the latter half), there are four states of error correction as follows.

State (a): Both the ECC code in the first half and the ECC code in the latter half are NG.

State (b): Only the ECC code in the first half is NG.

State (c): Only the ECC code in the latter half is NG.

State (d): Both the ECC code in the first half and the ECC code in the latter half are OK.

However, in a memory that incorporates the second ECC correcting unit, as in the present example, when the ECC code in the first half is NG, subsequent read operation is stopped. Therefore, the state (b) is included in the state (a), and one ECC error is expanded to two ECC errors.

In the second read process, the above problem of error expansion can be avoided by matching the read unit of the flash memories 7*a* to 7*e* with a unit of the second ECC code.

As described above, both high-speed reading and securing of reliability can be achieved in a storage device, by using both of the first read process of reading in a relatively large block by attaching weight to the reading speed, and the second read process of reading in a small block by attaching weight to precision of error correction.

Although a read unit in the second read process is desirably equal to the unit of the second ECC code, the read unit may be a page size of a flash memory when the flash memory is used as a recording medium. In this case, access to the flash memory becomes 16 sectors (when the page size is 8 Kbytes). Further, in a memory that incorporates the second ECC correcting unit as in the present example, even if a unit of the second ECC codes is a sector unit inside the memory, when access to the flash memory becomes 16 sectors, an error can only be detected in a 16 sector unit. However, because data is written into the flash memory in a page unit, correlativity is high regarding a reading error by retention that has high correlativity with the number of times of writing. That is, a page in which a one-sector error occurs has a high possibility that reading errors of several sectors occur in this page. Therefore, an influence rate in an error correction capacity (the second ECC code+the first ECC code) of a system is small.

Figure 6:
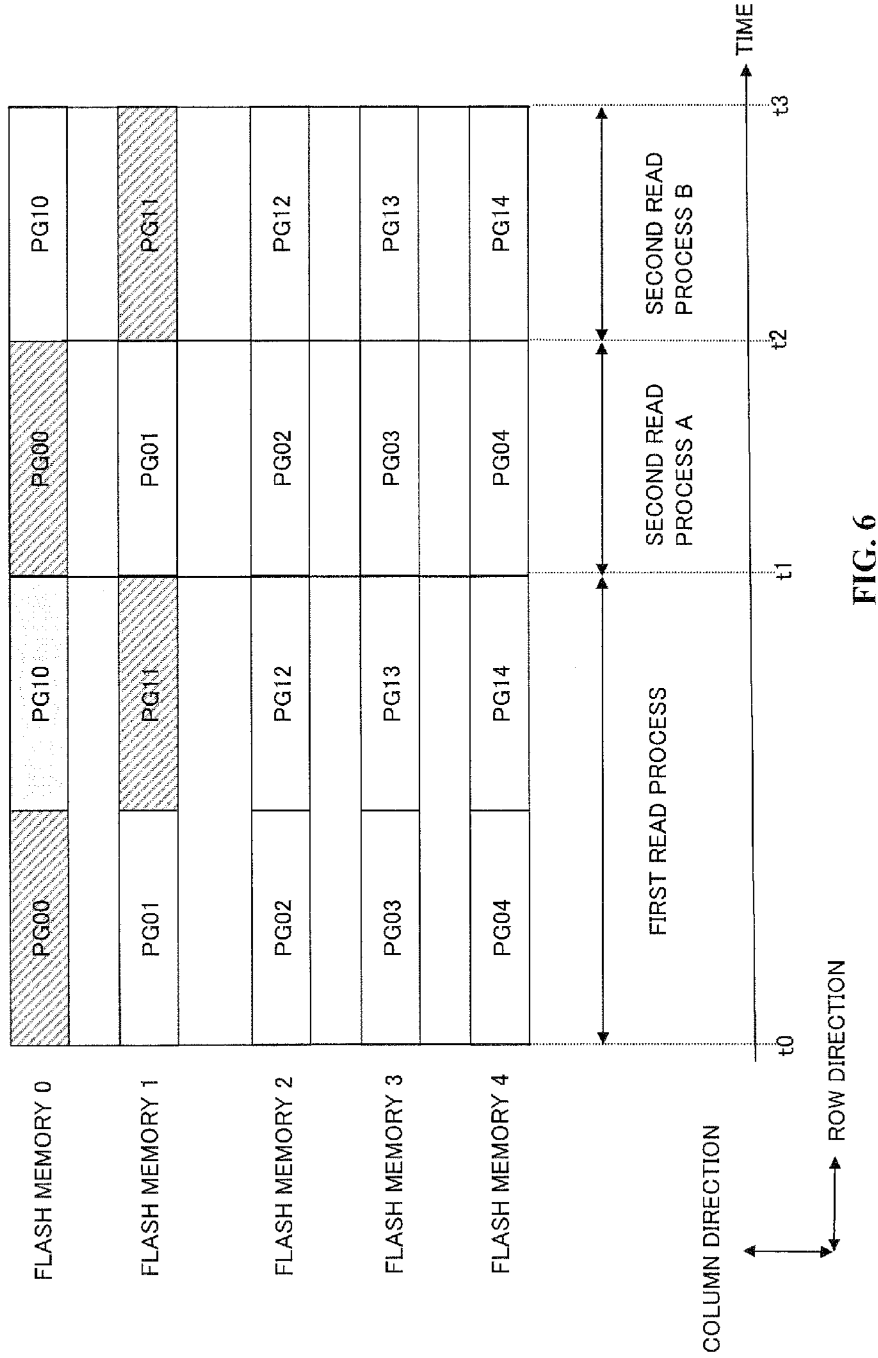
FIG. 6 is an explanatory diagram of a read sequence according to the first embodiment.

Next, an error correction process by the memory controller 2 will be described in more detail with reference to FIG. 6. FIG. 6 shows an error correction sequence in the first read process and the second read process.

In FIG. 6, PG00, PG10 denote data that are written into pages of a flash memory 0 (7*a*), and PG00 and PG10 denote data of two pages that can be read simultaneously. Actually, the pieces of data of two pages are not simultaneously output from a terminal of the flash memory, but after the pieces of data are simultaneously read out to caches inside the flash memories 7*a* to 7*e*, the pieces of data are read and transferred in the order of PG00 and PG10 from the terminal to the memory controller 2. Similarly, PG01, PG11 denote data written into pages of a flash memory 1 (7*b*). PG02, PG12 denote data written into pages of a flash memory 2 (7*c*).

PG03, PG13 denote data written into pages of a flash memory 3 (7*d*). PG04, PG14 denote data written into pages of a flash memory 4 (7*e*).

A data group (symbols) of page data PG00, PG01, PG02, PG03, PG04 and a data group (symbols) of PG10, PG11, PG12, PG13, PG14 along a column direction, respectively constitute a first ECC code.

In the present example, an access size (the first read unit) to the flash memory in the first read process is two pages that can be read simultaneously, and an access size (the second read unit) to the flash memory in the second read process is one page. Therefore, in the first read process, two pages are simultaneously read out to an internal cache of the flash memory, and the reading speed becomes about two times of a reading speed in the second read process.

Next, operation when an error is present in the read data PG00 and PG11 indicated by dashed lines will be described in detail with reference to FIG. 6.

First, the sequencer 6 performs the first read process in the first read unit in a two-page unit.

Therefore, at time to, in data reading in the flash memory 0 (7*a*) in the first read process, the sequencer 6 stops the process at the time when the sequencer 6 detects an error of the read data PG00, regardless of presence of an error in data PG10 that is subsequently read. Accordingly, in the first read process of accessing in a two-page unit, a reading error that is present only in PG00 becomes a reading error in two pages of the data PG00, PG10. This is because one ECC error is expanded to two ECC errors, corresponding to the state (b) that is included in the state (a).

In data reading in the flash memory 1 (7*b*), at time t0, a reading error is not detected in PG01, and a reading error is detected in subsequent PG11. In this case, access to the flash memory 1 (7*b*) becomes an error, but the data PG01 can be output (the data PG11 is not output because of the reading error). At time t0, reading from other flash memories of the flash memory 2 (7*c*), the flash memory 3 (7*d*), and the flash memory 4 (7*e*) is normally finished without a reading error.

The first ECC code in the first read process in the above case will be described. A reading error concerning the read data PG00 can be corrected in the first ECC code by using the read data PG01, PG02, PG03, PG04, because there is no error in these read data along the column direction which constitute the ECC code.

However, the error concerning the read data PG11 becomes double errors together with the read data PG11, because the read data PG10 that constitutes together the first ECC code is processed as an error. Therefore, the first ECC code that corresponds to only one error cannot correct the error, because the double errors are beyond the error correction capacity.

In the present example, as described above, when an error cannot be corrected in the first read process, the process is switched to the second read process in the second read unit that is smaller than the first read unit, and data reading is retried.

That is, when error correction is impossible in the first read process, at time t1, the sequencer 6 switches the process to the second read process in the second read unit that is smaller than the first read unit, and controls to retry the data reading. More specifically, the sequencer 6 issues a read command using a prefix sector number and the number of sectors to be read as parameters, to the flash memories 7*a* to 7*e*. In this case, the number of sectors to be read in the second read process is set to about a half of the number of sectors to be read in the first read process. Therefore, in the second read process of the present example, access is performed in each page to the flash memories 7*a* to 7*e*. Accordingly, as shown in FIG. 6, access is retried, by dividing read access relating to the first read process into a second read process A and a second read process B, each process having a half size.

Therefore, reading in the second read process A into which a read unit is switched is performed in a page unit as a read unit. Accordingly, in the reading at time t1, data that becomes an error is only the read data PG00 from the flash memory 7*a*. The sequencer 6 controls to correct the error data P00, by the first ECC correcting unit 3*b*, using the page data PG01, PG02, PG03, PG04 in the column direction which constitute the first ECC code.

Next, at time t2, the page data PG10, PG12, PG13, PG14 are read in a similar manner. Because the pieces of page data are controlled in the second read process A in this way, the page data PG10 that is an error in the first read process is read without an error. Therefore, only the page data PG11 is read as the error data. The sequencer 6 can control to correct the error data P11, by the first ECC correcting unit 3*b*, using the page data PG10, PG12, PG13, PG14 in the column direction which constitute the first ECC code.

As described above, according to the second read processes A, B of the present example, because errors can be accommodated within a range of an error correction capacity (one error correction), even if there is the read data PG11 that cannot be corrected in the first read process, the reading error can be corrected.

3. Effect

As described above, in the first embodiment, control is performed by using and by switching between both the first read process of reading in a relatively large block by attaching weight to high speed, and the second read process of reading in a small block by attaching weight to precision of error correction. Therefore, the first embodiment is advantageous in that both high-speed reading and securing of error-corrected data of reliability can be achieved in the storage device 10.

Figure 1:
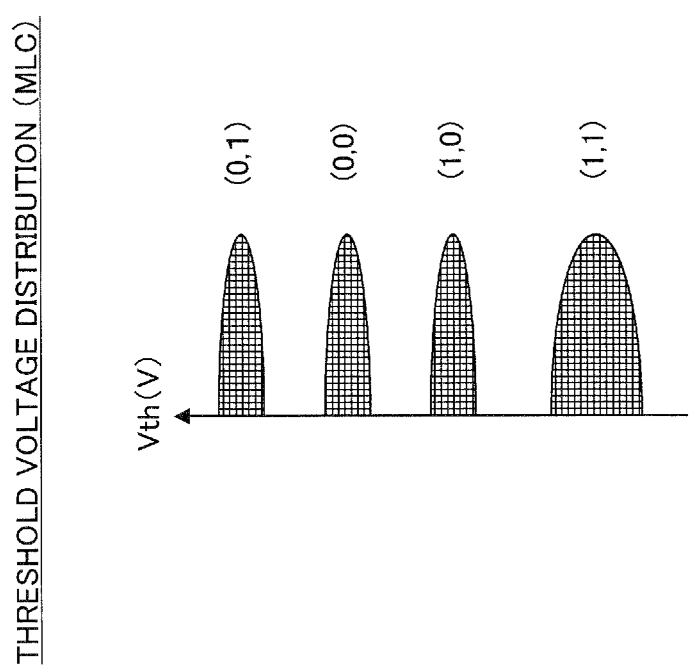
FIG. 1 is a schematic view showing an accumulation state of electrons of a multi-value flash memory.
Figure 2:
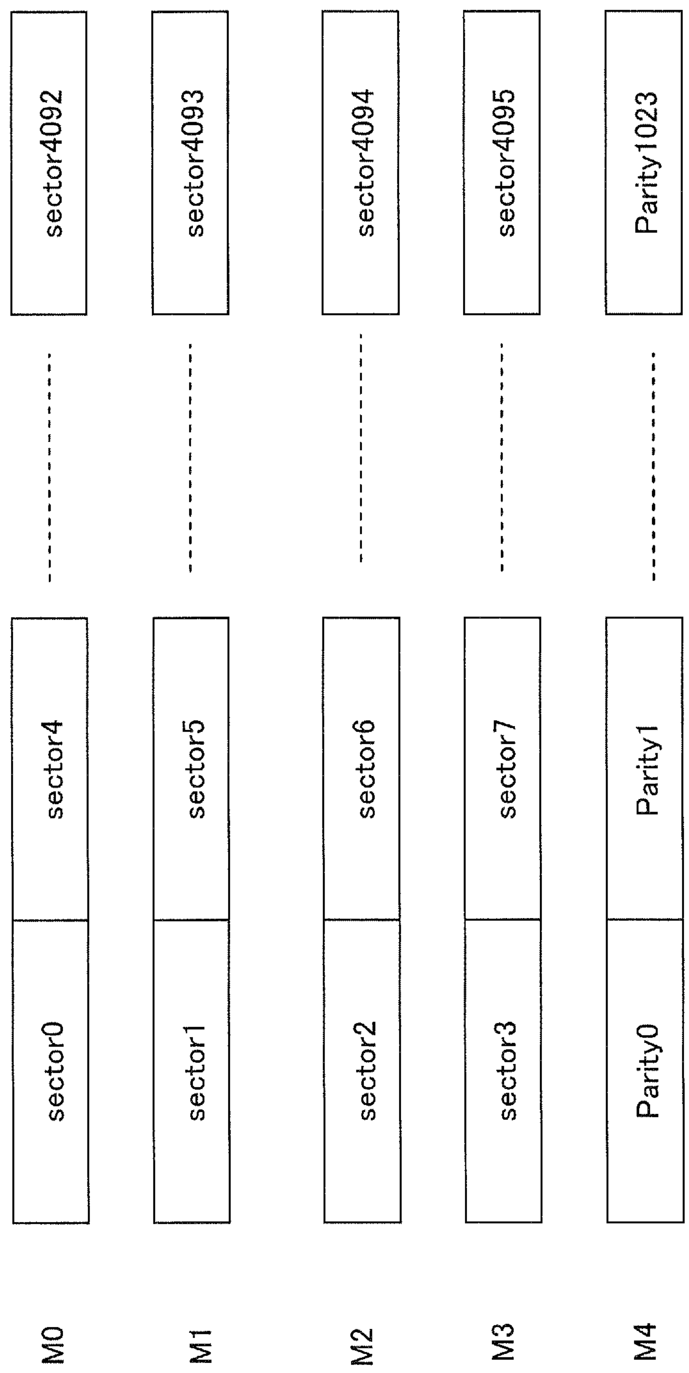
FIG. 2 is a view showing a sector layout in an information recording and reproducing device.

Specifically, in the first embodiment, data is read by using two pages as the first read unit, in the first read process, within a range not exceeding an error correction capacity. For this purpose, as compared with the case of reading data in a page unit, a data reading speed can be increased to about two times. Further, even if an error occurs, the process is switched to the second read process, and data is read by using one page as the second read unit, and by doubling precision of error correction. Therefore, even if a data holding characteristic in a flash memory is degraded, an error can be corrected, and reliability of data can be secured. This is advantageous in that, even when degradation in a data holding characteristic progresses, as compared with a two-value memory (SLC: Single Level Cell), as in the multi-value flash memory (MLC) shown in FIG. 1, for example, reliability of data can be secured without increasing cost.

In the example shown FIG. 6, data reading is performed, by dividing the second read process into two second read processes A and B. However, according to the second read process A, because an error can be corrected in the first read process as well, the two read processes are not necessarily required to be performed.

In the first embodiment, although a flash memory is used as an example of a memory of a recording medium, a similar effect can be obtained, when a recording medium is recorded with data configured by an iterated code.

In the first embodiment, although five flash memories 7*a* to 7*e* have been described, a similar effect can also be obtained when the second read process in the first embodiment is repeated five times by using one flash memory. In such a case, the read unit of the first read process may be set to a unit of the first ECC code.

An error correction process by the first ECC correcting unit 3*b* in the second read process is performed by using an error sector detected in high precision by an error correction process performed by the first ECC correcting unit 3*b* in the first read process. Therefore, an error correction process by the first ECC correcting unit 3*b* in the first read process may be performed or may not be performed depending on a situation.

Although a flash memory in the present embodiment is installed with an ECC function as an example, the flash memory can also be applied to a general-purpose memory card such as a memory card, for example.

Although it has been described that the number of flash memories is five, the number is not limited thereto, and a similar effect can be obtained as long as the flash memories are configured to be able to be simultaneously accessed in a plurality of pages.

Second Embodiment

Configuration Example

A configuration according to a second embodiment is substantially similar to that in the first embodiment, and therefore, a detailed description thereof is omitted.

In the first embodiment, the first ECC code is a (5, 4) ECC code, and this code is applied to only one error correction. On the other hand, in the present embodiment, the first ECC code is a (10, 8) ECC code, and this is applied to correction of double errors.

The first ECC generating unit 3*a* in the first embodiment allocates continuous 2-Kbyte data to four flash memories in a 512-byte unit, calculates EXOR of 4-byte data obtained by extracting each one byte from the 512-byte data allocated to each flash memory, and generates 1-byte parity data.

The first ECC generating unit 3*a* in the present second embodiment allocates continuous 64-Kbyte data to four flash memories 7*a* to 7*d* in a 16-Kbyte unit, and extracts each two byte from the 16 Kbyte-data allocated to each flash memory in an 8-Kbyte cycle. Then, the first ECC generating unit 3*a* generates a (10, 8) ECC code from 8-byte data allocated to the four flash memories 7*a* to 7*d*. In the (10, 8) ECC code, 2-byte parity data is generated from the 8-byte data. Therefore, pieces of parity data of 16 Kbytes in total are generated from 64-Kbyte data, and these data are allocated to the flash memory 7*e*.

In this case, it is desirable that the 16-Kbyte data to be allocated to each flash memory are allocated to different pages of a flash memory in an 8-Kbyte unit. This is because write into a flash memory is performed in a page unit, in order to decrease the number of times of rewriting, it is better to write continuous sectors into the same page. Further, variation of a retention characteristic of a flash memory greatly depends on the page as a minimum unit of the number of times of rewriting.

Generation of the (10, 8) ECC code in this case will be described in detail. Assuming a sector number is N_Sec, 128 sectors corresponding to 64 Kbytes are allocated as follows.

Flash memory 0: Sectors of (N_Sec %128)/32<1

Flash memory 1: Sectors of 1≤(N_Sec %128)/32<2

Flash memory 2: Sectors of 2≤(N_Sec %128)/32<3

Flash memory 3: Sectors of 3≤(N_Sec %128)/32<4

(The above %128 denotes a remainder after dividing by 128.)

In 32 sectors allocated to each flash memory, continuous 16 sectors are allocated to the same page of each flash memory.

For symbols that constitute an (10, 8) ECC code, eight bytes in total are extracted, each one byte from a group of sectors that satisfies the following equation (*).

$$N\_Sec\ \%128=\{K,K+16,K+32,K+48,K+64,K+80,K+96,K+112\}\ (K \text{ is an integer of } 0\le K<128) \qquad \text{Equation (*)}$$

Generated 2-byte parity data (P0, P1) are allocated to different pages in the flash memory 4.

Figure 7:
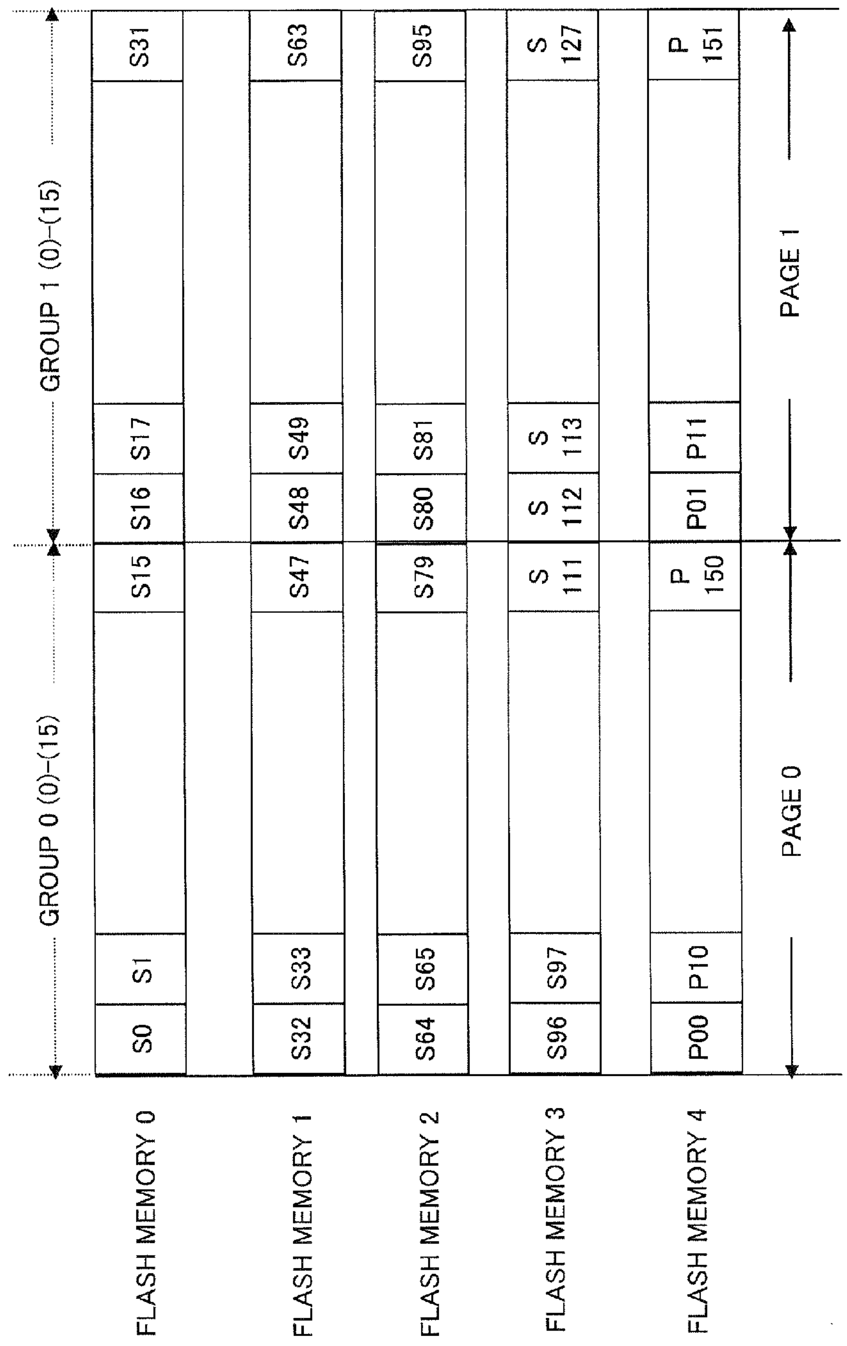
FIG. 7 is a layout diagram of sectors according to a second embodiment.

FIG. 7 shows allocation of sectors of 64 Kbytes. In FIG. 7, numbers having S as a prefix in flash memories 0 to 3 denote sector numbers. A lowest one bit of a number having P as a prefix in the flash memory 4 identifies a byte of parity data configured by two bytes, and other bits indicate a group to which the parity data belongs. For example, a lowest one bit "0" of a number that has P as a prefix in page 0 of the flash memory 4 identifies a byte of parity data, and other bits "0" to "15" denote a group (Group 0 (0) to (15)) to which the parity data belongs.

As shown in FIG. 7, sectors S0 to S31 are allocated to the flash memory 0 (7*a*), sectors S32 to S63 are allocated to the flash memory 1 (7*b*), sectors S64 to S95 are allocated to the flash memory 2 (7*c*), and sectors S96 to S127 are allocated to the flash memory 3 (7*e*). In each flash memory, first 16 sectors and latter 16 sectors are allocated to different pages. Next, each one byte for each 16 sectors (each one byte from S0, S16, S32, S48, S64, S80, S96, S112) is extracted, and pieces of parity data of two bytes are generated by the (10, 8) ECC code, and the pieces of generated parity data are allocated to sectors P00 and P01 in FIG. 7. Based on this allocation, ten symbols that constitute the (10, 8) ECC code can be allocated to different pages of the flash memory.

By repeating these processes for 512 times by the first ECC generating circuit 3*a*, a generation process of the first ECC code in each sector (for example, S0, S16, S32, S48, S64, S80, S96, S112) is completed. Because the processes are performed using 16 sectors in FIG. 7, the number of times of generating the first ECC code is (512*16).

Read Operation

Read operation of reading pieces of data which are similarly written into the flash memories 7*a* to 7*e* after generating the first ECC code in this way will be described below.

In the first embodiment, both the first read process of reading in a relatively large block and the second read process of reading in a small block by attaching weight to precision of error correction are used. Then, the example of achieving both high-speed reading and securing of reliability in the storage device will be described.

In the second embodiment, as described above, the first ECC code is double corrected. In the first read process, only one error correction is performed by reading in a first block size larger than a block size in the second read process. In the second read process, data is read in a second block size which is obtained by dividing the first block size into two or more. After the reading corresponding to the first block size is finished, correction of double errors is performed by the first ECC code.

Error Correction Sequence

Figure 8:
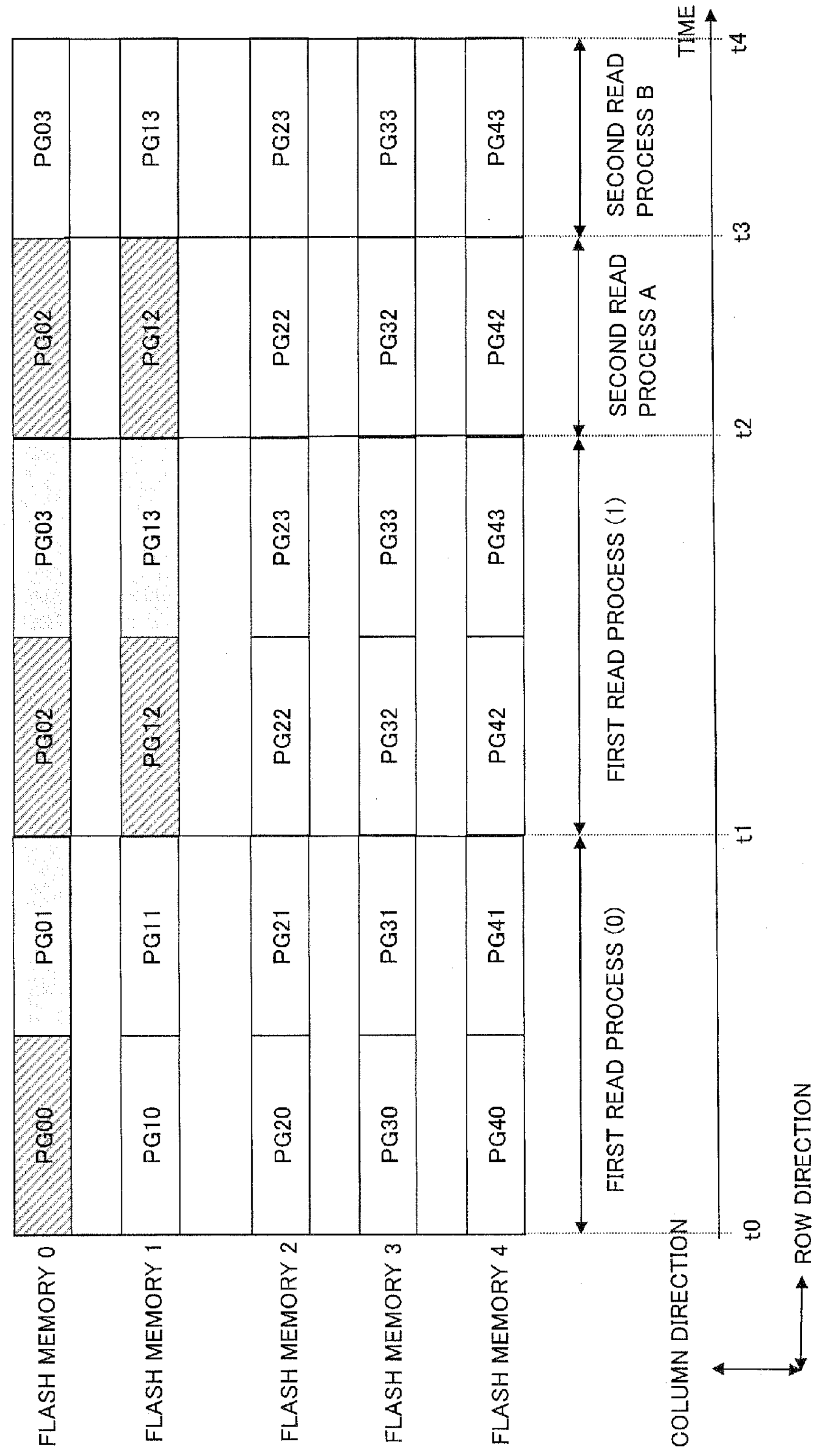
FIG. 8 is an explanatory diagram of a read sequence according to the second embodiment.

FIG. 8 is a view describing an error correction sequence in the first read process and the second read process according to the second embodiment.

In FIG. 8, data PG00 and PG01 are data written into pages of the flash memory 0 (7*a*). The data PG00 and PG01 are data that can be simultaneously read from two pages. Actually, the pieces of data in two pages are not simultaneously output from a terminal of the flash memory 7*a*, but after the pieces of data are simultaneously read out to an internal cache of the flash memory 7*a*, the pieces of data are read from the terminal in the order of the data PG00 and PG01. Similarly, data PG10, PG11 are data written into pages of the flash memory 1 (7*b*). Data PG20, PG21 are data written into pages of the flash memory 2 (7*c*). Data PG30, PG31 are data written into pages of the flash memory 3 (7*d*). Data PG40, PG41 are data written into pages of the flash memory 4 (7*e*).

The first ECC code as the (10, 8) ECC code is written into ten pages of the data PG00, PG01, PG10, PG11, PG20, PG21, PG30, PG31, PG40, PG41. Even if reading errors occur in two pages, the errors can be corrected.

Used flash memories are those which incorporate processes relating to the second ECC code, similarly to the first embodiment. An access size to the flash memory in the first read process is two pages from which data can be simultaneously read. An access size to the flash memory in the second read process is one page. Therefore, in the first read process, because pieces of data are simultaneously read from two pages into the internal cache of the flash memory, a reading speed becomes about two times of a reading speed in the second read process.

First, operation when an error is present only in the data PG00 indicated by dashed lines in a first read process (0) in FIG. 8 will be described.

At time t0, in data reading in the flash memory 0 (7*a*) in the first read process (0) using a two-page unit as the access size to the flash memory, the sequencer 6 stops the process at the time when the sequencer 6 detects an error of the data PG00, regardless of presence of an error in the data PG01. Accordingly, in the first read process (0), the reading error that is present only in the PG00 becomes an error in two pages of the data PG00, PG01. A reading error does not occur in the data reading from the flash memory 1 (7*b*) to the flash memory 4 (7*e*). In this case, out of the ten symbols (PG00 to PG41) that constitute the first ECC code, two symbols of the data PG00 and PG01 become errors. However, as described above, when reading errors (double errors) occur in two symbols, the errors can also be corrected in the (10, 8) first ECC code of the present example. Because the errors are within the range of error correction capacity, the errors can be corrected in the first read process (0).

Next, operation in the first read process (1) when errors are present in the data PG02 and PG12 indicated by dashed lines will be described.

At time t1, in the reading from the flash memory 0 (7*a*), the process is stopped at the time when the error of the data PG02 is detected, regardless of presence of an error in the data PG03. Therefore, in the present process of accessing in a two-page unit, the reading error that is present only in the data PG02 becomes errors of the data PG02 and PG03 in two pages. In the reading from the flash memory 1 (7*b*), the reading error that is present only in the data PG12 becomes errors of the data PG12 and PG13 in two pages. On the other hand, in the reading from the flash memory 2 (7*c*) to the flash memory 4 (7*e*), a reading error does not occur. In this case, out of ten symbols (each one byte is extracted from ten pages of PG02, PG03, PG12, PG13, PG22, PG23, PG32, PG33, PG42, PG43) that constitute the first ECC code, errors are expanded not only to the data PG02 and PG12, but also to four symbols including the data PG03 and PG13. Therefore, in the first ECC code in the present example, the errors are out of the range of the error correction capacity, and the errors cannot be corrected in the first read process (1).

Accordingly, retry in the first read process (1) is performed, by the second read process A and the second read process B. In the second read process, an access size to a flash memory is in a page unit. However, read data in the case of accessing one time in the second read process becomes five pages, and this does not reach the number of pages (ten pages) that is necessary for error correction by the first ECC code. Therefore, error correction by the first ECC code is performed, after performing reading for two times in the second read process A and the second read process B, as shown in FIG. 8. Although reading errors occur in PG02 and PG12 in the second read process A, a reading error does not occur in the second read process B. Therefore, errors occur in two pages out of the ten pages, and the errors occur in two symbols out of the ten symbols that generate the first ECC code. Consequently, these errors can be corrected.

More specifically, at time t2, when errors cannot be corrected in the first read process (1), the sequencer 6 switches the process to the second read processes A, B in the second read unit that is smaller than the first read unit (1), and retries the data reading. More specifically, the sequencer 6 issues a read command using a prefix sector number and the number of sectors to be read as parameters, to the flash memories 7*a* to 7*e*. In this case, the number of sectors to be read in the second read process is set to about a half of the number of sectors to be read in the first read process. Therefore, in the second read process of the present example, access is performed to each page in the flash memories 7*a* to 7*e*. Accordingly, as shown in FIG. 6, read access relating to the first read process is retried by dividing the process into two second read processes A and B, each having a half size.

That is, in the second read process A, at time t2, the sequencer 6 performs access to the flash memories 7*a* to 7*e* in a page unit, and secures a half (five symbols) of the number of symbols necessary for error correction by the first ECC code of five pages.

Subsequently, at time t3, the sequencer 6 performs the similar second read process B, accesses the flash memories 7*a* to 7*e* in a page unit, and secures a half (five symbols) of the number of symbols necessary for error correction by the first ECC code of remaining five pages.

Next, the first ECC correcting unit 3*b* corrects the error data (PG02, PG12) by the (10, 8) first ECC code, by using the ten symbols (PG02, PG03, PG12, PG13, PG22, PG23, PG32, PG33, PG42, PG43) that are secured by reading for two times in the second read process A and the second read process B. As a result, errors that cannot be corrected in the first read process can be corrected.

Effect

As described above, in the second embodiment, correction capacity of the first ECC code is set as correction of double errors. Only one error is corrected in the first read process in which an access size to a flash memory is relatively large. The flash memory which is accessed in the first read process is accessed for two or more divided times in the second read process. With this arrangement, two errors are corrected. Therefore, both high-speed reading and securing of reliability in the storage device 10 can be achieved. Error correction can also be applied to double correction where correction capacity is reinforced as in the present example.

Although the number of errors to be corrected by the first ECC code is two in the present embodiment, correction of three errors, correction of four errors and the like can be realized in a similar configuration, as long as the number of errors to be corrected is two or more. In the case of correction of four errors, an access size to a flash memory in the first read process becomes four times of an access size to access to the flash memory in the second read process.

Although a flash memory that includes the ECC function is taken as an example of the flash memory in the present embodiment, the flash memory can also be applied to a general-purpose memory card such as a memory card.

Although it has been described that the number of flash memories is five, the number is not limited thereto, and a similar effect can be obtained as long as the flash memories are configured to be able to be simultaneously accessed in a plurality of pages.

Modification

Although a flash memory that incorporates the second ECC correcting unit has been described in the first embodiment and the second embodiment, the second ECC correcting unit can also be incorporated at a controller side.

Configuration Example

Figure 9:
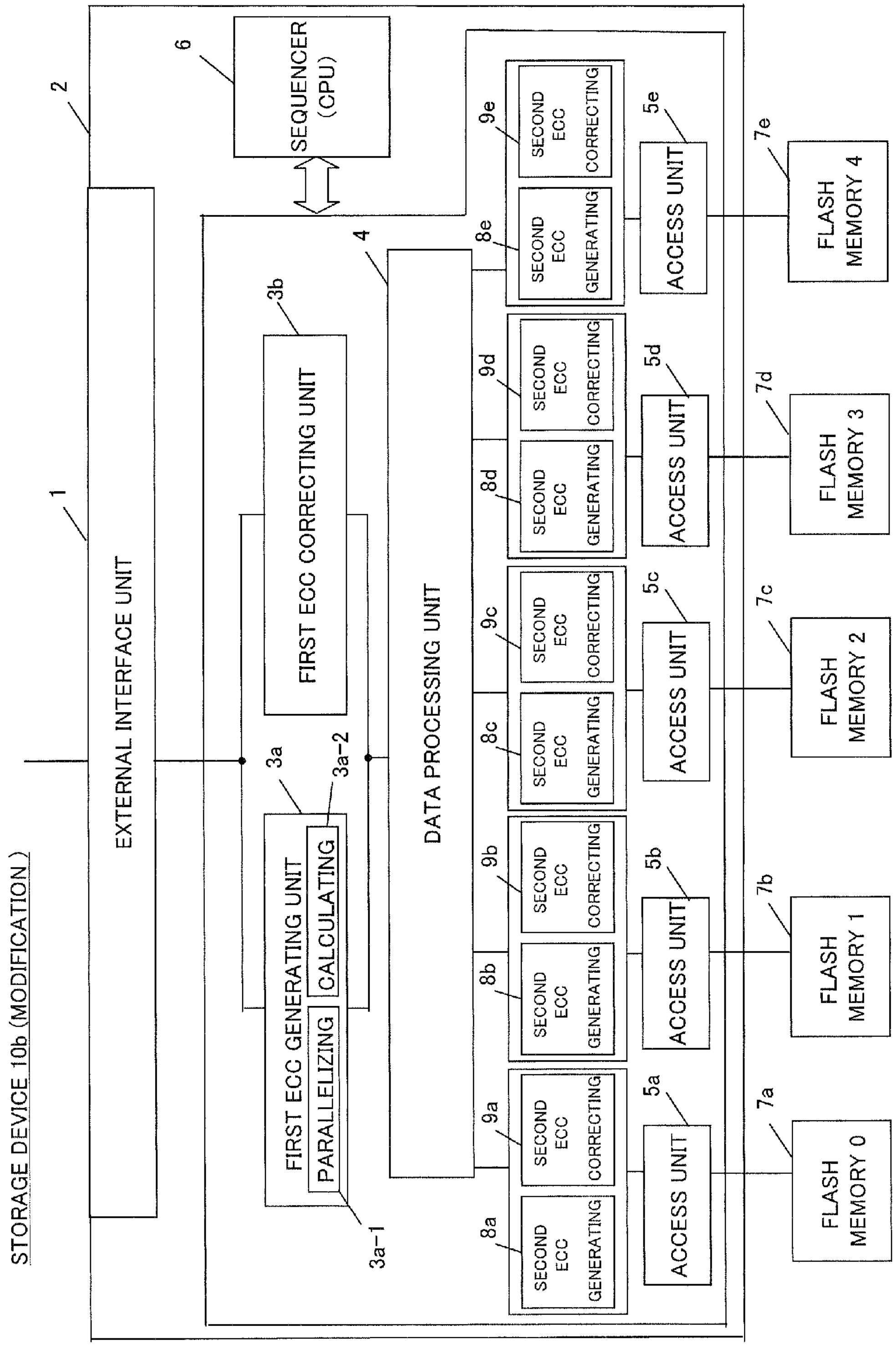
FIG. 9 is an internal configuration diagram of a storage device according to a modification.

FIG. 9 shows an example of an overall configuration of the storage device 10*b* according to a modification. As shown in FIG. 9, the modification is different from the first and second embodiments in that the second ECC generating units 8*a* to 8*e* and the second ECC correcting units 9*a* to 9*e* are not incorporated in the flash memories 7*a* to 7*e*, but are incorporated in the controller 2.

In the case of the second ECC generating units 8*a* to 8*e* and the second ECC correcting units 9*a* to 9*e* being installed in the flash memories 7*a* to 7*e*, when the second ECC correcting units 9*a* to 9*e* become unable to correct errors, subsequent read data cannot be transferred to the memory controller.

However, as in the present modification, when the second ECC correcting units 9*a* to 9*e* are installed in the memory controller 2, even if the second ECC correcting units 9*a* to 9*e* become unable to correct errors, subsequent operation can be continued since pieces of read data are transferred from the flash memories 7*a* to 7*e* to the controller 2. Therefore, in the case of the present modification, when pieces of data are read in a unit equal to or larger than the correction unit of the second ECC correcting units 9*a* to 9*e*, information from the second ECC correcting units 9*a* to 9*e* is not dropped.

In the case of the present modification, in the first read process, when the first read unit is set larger than the second read unit and when the first ECC code is passed through as in the first embodiment, there is no influence of throughput of first ECC correction and operation latency. Therefore, by using both the first read process and the high-reliability second read process, a high-speed and high-reliability storage device can be provided.

In the first read process, when the first read unit is set larger than the second read unit and when the first ECC correction is used by a capacity equal to or smaller than the correction capacity as in the second embodiment, higher throughput, lower power consumption, and lower latency are obtained than those when the first ECC correction is used by a maximum correction capacity. Therefore, by using both the first read process and the high-reliability second read process, a high-speed and high-reliability storage device can be provided.

The present invention has been described above with reference to the first and second embodiments and the modification. However, the present invention is not limited to the above embodiments and the modification, and can be variously modified within a range not deviating from the gist of the present invention at an implementation stage. Further, the above embodiments and the modification include various stages of inventions, and various inventions can be extracted based on suitable combinations of a plurality of configuration requirements disclosed.

INDUSTRIAL APPLICABILITY

According to the present embodiments, the storage device achieves high-speed transfer and high reliability, by configuring ECC codes across a plurality of flash memories and by improving error resistance and by switching two reproduction modes based on a capacity of error correction. Therefore, there is a higher possibility that the storage device is used in a processing device of business memory cards and image data that is required to achieve high-speed transfer and high reliability.

What is claimed is:

1. A memory controller that writes write data provided from a host device into a memory, reads read data from the memory, and transmits the read data to the host device, the memory controller comprising:

an external interface configured to transmit and receive the write data/the read data to and from the host device;

a first ECC generating unit configured to generate parity data and a first ECC code for the write data;

an access unit configured to control writing and reading of the write data/the read data or parity data to and from the memory;

a first ECC correcting unit configured to correct an error of read data, by using data and parity data read from the memory via the access unit; and a control unit configured to control the external interface, the first ECC generating unit, the access unit, and the first ECC correcting unit, wherein the control unit reads data in a first read unit upon reading data from the memory, and when an error occurs in the data read in the first read unit, reads the data in a second read unit having a reading size smaller than that of the first read unit by switching the first read unit to the second read unit, and controls the first ECC correcting unit to correct an error of the data that is read in the second read unit, by using the first ECC code.

2. The memory controller according to claim 1, wherein the first ECC generating unit generates a first ECC code that can correct N errors (N is an integer equal to or larger than two), and the control unit reads data in the first read unit upon reading data from the memory, and corrects M errors (M is an integer equal to or larger than 0 that satisfies $M<N$), by using the first ECC code, reads data in the first read unit, and when an error occurs in the data read in the first read unit, reads the data in a second read unit having the reading size smaller than that of the first read unit by switching the first read unit to the second read unit, and corrects N errors of the data read in the second read unit, by using the first ECC code, with the first ECC correcting unit.

3. The memory controller according to claim 1, wherein a plurality of memories, each identical to the memory, are connected to the controller, access units, each identical to the access unit, are arrayed in the same number as that of the memories, and the control unit causes each of symbols composing the first ECC code to be recorded into each of the plurality of memories that are mutually different, via each of the plurality of access units.

4. The memory controller according to claim 1, wherein the memory includes a second ECC generating unit configured to generate a second ECC code from a plurality of symbols orthogonal to a plurality of symbols constituting the first ECC code, and a second ECC correcting unit configured to correct an error of data read from the second ECC code, and the control unit controls to correct an error of data that the second ECC correcting unit cannot correct, by the first ECC correcting unit, upon reading read data from the memory.

5. The memory controller according to claim 1, further comprising:

a second ECC generating unit configured to generate a second ECC code from a plurality of symbols orthogonal to a plurality of symbols constituting the first ECC code; and a second ECC correcting unit configured to correct an error of data read from the second ECC code, and the control unit controls to correct an error of data that the second ECC correcting unit cannot correct, by the first ECC correcting unit, upon reading read data from the memory.

6. The memory controller according to claim 4, wherein the control unit writes the second ECC code into the memory, in a block unit that constitutes the memory.

7. The memory controller according to claim 1, wherein the controller issues an internal read command having a prefix sector number and the number of continuous sectors as parameters, to the memory, upon reading data in the first read unit or in the second read unit, and controls to stop subsequent read operation, when an error of the data read in the first read unit cannot be corrected.

8. The memory controller according to claim 1, wherein the memory is a nonvolatile memory, and the first read unit is a unit of integer times of a page as a read unit of the nonvolatile memory.

9. The memory controller according to claim 1, wherein the memory is a nonvolatile memory, and the first read unit is a unit of a page as a read unit of the nonvolatile memory.

10. A storage device comprising: a memory configured to store data transmitted to a host device; and a controller configured to control the memory, the storage device writing write data provided from the host device into the memory, reading read data from the memory, and transmitting the read data to the host device, wherein the memory controller includes:

an external interface configured to transmit and receive the write data/the read data to and from the host device;

a first ECC generating unit configured to generate parity data and a first ECC code to the write data;

an access unit configured to control writing and reading of the write data/the read data or parity data to and from the memory;

a first ECC correcting unit configured to correct an error of the read data, by using the data and the parity data read from the memory via the access unit; and a control unit configured to control the external interface, the first ECC generating unit, the access unit, and the first ECC correcting unit, and the control unit reads data in a first read unit upon reading data from the memory, and when an error occurs in the data read in the first read unit, reads the data in a second read having a reading size smaller than that of the first read unit by switching the first read unit to the second read unit, and controls to correct an error of the data that is read in the second read unit, by the first ECC correcting unit by using the first ECC code.

* * * * *